United States Patent
Shim

(10) Patent No.: US 7,268,040 B2
(45) Date of Patent: Sep. 11, 2007

(54) METHOD OF MANUFACTURING A SELECT TRANSISTOR IN A NAND FLASH MEMORY

(75) Inventor: Keon Soo Shim, Kyeongki-Do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 115 days.

(21) Appl. No.: 11/101,672

(22) Filed: Apr. 8, 2005

(65) Prior Publication Data
US 2006/0110881 A1   May 25, 2006

(30) Foreign Application Priority Data
Nov. 24, 2004   (KR) ...................... 10-2004-0097161

(51) Int. Cl.
*H01L 21/336* (2006.01)
(52) U.S. Cl. ...................... 438/257; 438/289; 438/238; 438/381; 257/E21; 257/654; 257/657; 256/E21; 256/659
(58) Field of Classification Search ................ 438/257, 438/259, 266, 267, 270, 238, 381, 283, 290, 438/289
See application file for complete search history.

(56) References Cited

U.S. PATENT DOCUMENTS

| | | | | |
|---|---|---|---|---|
| 5,559,351 A | * | 9/1996 | Takiyama | 257/324 |
| 5,877,054 A | * | 3/1999 | Yamauchi | 438/264 |
| 6,009,017 A | * | 12/1999 | Guo et al. | 365/185.28 |
| 6,456,535 B2 | * | 9/2002 | Forbes et al. | 365/185.28 |
| 6,465,834 B1 | * | 10/2002 | Nakazato et al. | 257/314 |
| 6,898,116 B2 | * | 5/2005 | Peng | 365/177 |
| 7,011,999 B2 | * | 3/2006 | Minami et al. | 438/210 |
| 7,084,037 B2 | * | 8/2006 | Gamo et al. | 438/287 |

* cited by examiner

*Primary Examiner*—David Nhu
(74) *Attorney, Agent, or Firm*—Marshall, Gerstein & Borun LLP

(57) ABSTRACT

Disclosed herein is a method of manufacturing a flash memory device. According to the present invention, a method of manufacturing a NAND flash memory device having a memory cell and a select transistor, wherein a graph showing the relation between the length of a gate electrode of the select transistor and the leakage current of the select transistor, and a graph showing the relation between an ion implant dose for controlling a threshold voltage of a memory cell and the leakage current of the select transistor are provided includes the steps of finding the leakage current of a select transistor, which corresponds to the length of a gate electrode of a current select transistor, and finding an ion implant dose for controlling a threshold voltage of a memory cell, which corresponds to the leakage current, and finding the leakage current of a select transistor, which allows the ion implant dose for controlling the threshold voltage of the memory cell to become an ion implant dose for controlling a threshold voltage of a desired memory cell, and finding and increasing the length of the gate electrode of the select transistor, which corresponds to the leakage current of the select transistor.

5 Claims, 2 Drawing Sheets

METHOD OF MANUFACTURING A SELECT TRANSISTOR IN A NAND FLASH MEMORY

BACKGROUND

1. Field of the Invention

The present invention relates to a semiconductor device, and more specifically, to a method of manufacturing a select transistor in a NAND flash memory.

2. Discussion of Related Art

Generally, in a NAND flash memory device, select transistors disposed at both ends of a string select the string upon program, erase and read operation.

A leakage current may be occurred at unselected string of unselected blocks during a read operation of a selected block, thereby causing read error to occur. Hence, it is necessary to control the leakage current of the select transistor.

The leakage current must be maintained at lower than 5 pA at room temperature and Vd=1V. To this, a threshold voltage implant is performed in a cell region as well as a select transistor region, and the threshold voltage implant is performed by only opening the select transistor region, once more. That is, twice threshold voltage implant are performed at the select transistor region. An area opened by the threshold implantation mask for the select transistor becomes small since the select transistor region is only opened. Accordingly, an implant ion is not implanted to a portion of a channel region for the select transistor due to a shadowing effect and the channel region of the select transistor is not uniform. Accordingly, there is a problem in terms of securing the characteristic of the select transistor.

Therefore, in a method of manufacturing a NAND flash memory device, there is a need for methods in which the leakage current of the select transistor can be controlled.

SUMMARY OF THE INVENTION

Accordingly, the present invention has been made in view of the above problems, and it is an object of the present invention to provide a method of manufacturing a select transistor in a NAND flash memory, wherein the leakage current of the select transistor can be controlled.

To achieve the above object, according to an aspect of the present invention, there is provided a method of manufacturing a select transistor in a NAND flash memory, comprising a first step of providing a first graph showing the relation between the length of a gate electrode of the select transistor and the leakage current of the select transistor, and a second graph showing the relation between an ion implant dose for controlling a threshold voltage of a memory cell and the leakage current of the select transistor, a second step of finding the leakage current of the select transistor, which corresponds to the length of the gate electrode of the select transistor that is currently being used, in the first graph, a third step of finding an ion implant dose for controlling the threshold voltage of the memory cell, which corresponds to the leakage current of the select transistor, which is found in the second step, in the second graph, a forth step of finding the leakage current of the select transistor, which allows the ion implant dose for controlling the threshold voltage of the memory cell, which is found in the third step, to become a desired ion implant dose for controlling a threshold voltage of a memory cell, in the second graph, a fifth step of finding the length of the gate electrode of the select transistor, which corresponds to the leakage current of the select transistor, which allows for the desired ion implant dose for controlling the threshold voltage of the memory cell, which is found in the third step, in the first graph, and a sixth step of increasing the length of the gate electrode of the select transistor, which is found in the fifth step.

In the sixth step, the length of the gate electrode of the select transistor is preferably increased only toward a direction in which a space with the memory cell located at an edge portion of the select transistor is reduced.

According to another aspect of the present invention, there is provided a method of manufacturing a select transistor in a NAND flash memory, comprising the steps of providing a graph showing the relation between the length of a gate electrode of the select transistor and the leakage current of the select transistor, and a graph showing the relation between an ion implant dose for controlling a threshold voltage of a memory cell and the leakage current of the select transistor, finding the leakage current of a select transistor, which corresponds to the length of a gate electrode of a current select transistor, and finding an ion implant dose for controlling a threshold voltage of a memory cell, which corresponds to the leakage current, finding the leakage current of a select transistor, which allows the ion implant dose for controlling the threshold voltage of the memory cell to become an ion implant dose for controlling a threshold voltage of a desired memory cell, and finding and increasing the length of the gate electrode of the select transistor, which corresponds to the leakage current of the select transistor.

The length of the gate electrode of the select transistor is preferably increased only toward a direction in which a space with the memory cell located at an edge portion of the select transistor is reduced.

DETAILED DESCRIPTION OF PREFERRED EMBODIMENTS

Now, the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later.

The present invention provides a method of determining the gate length of a select transistor to control the leakage current thereof without an ion implant process for controlling the threshold voltage of the select transistor.

Figure 1:
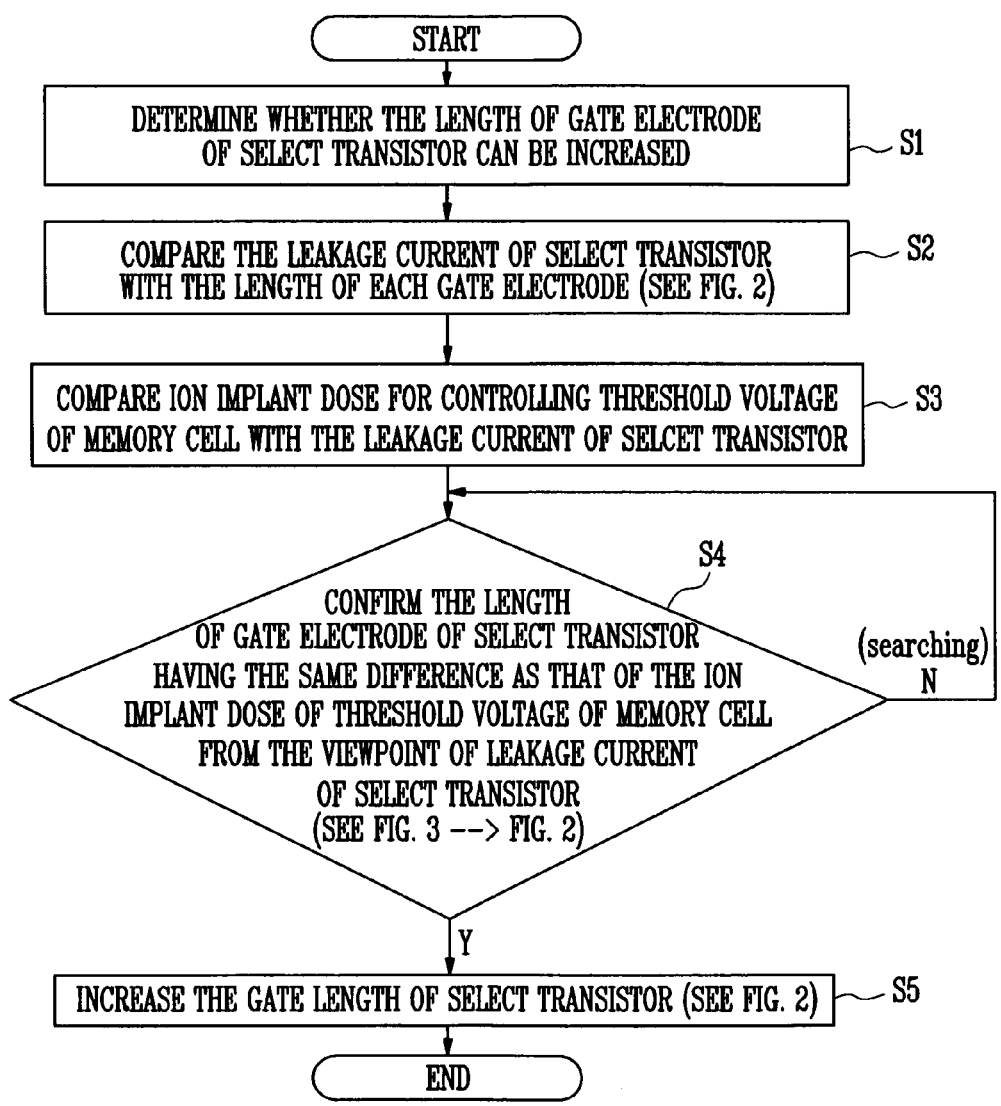
FIG. 1 is a flowchart illustrating a method of increasing the gate length of a select transistor the leakage current of which is controlled even without an ion implant process for controlling a threshold voltage of a select transistor according to the present invention.
Figure 2:
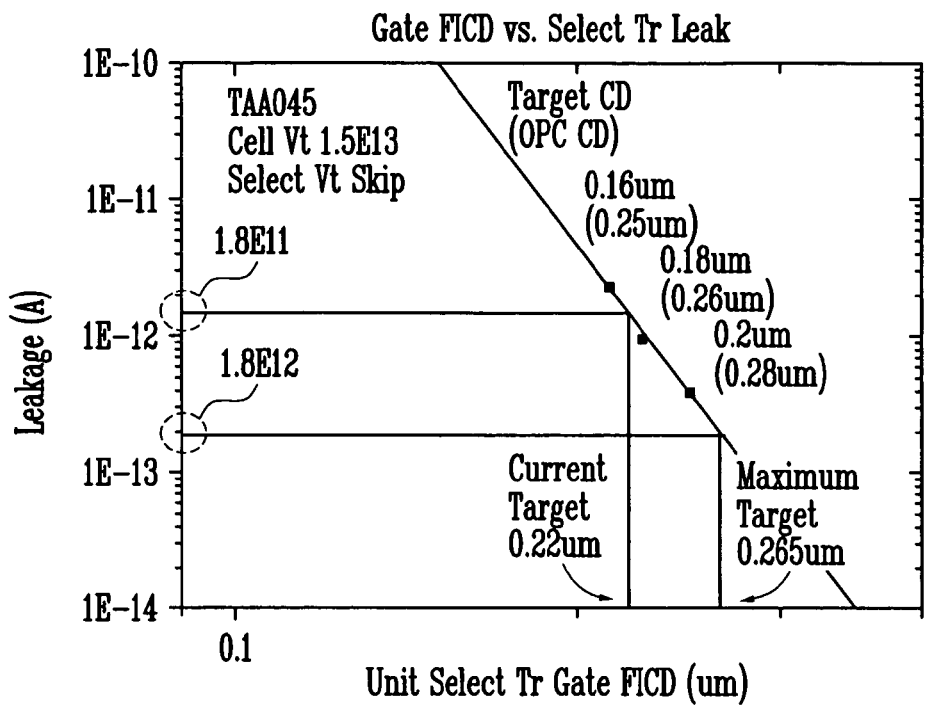
FIG. 2 is a graph showing the leakage current of a select transistor depending upon the gate electrode length of the select transistor according to the present invention.
Figure 3:
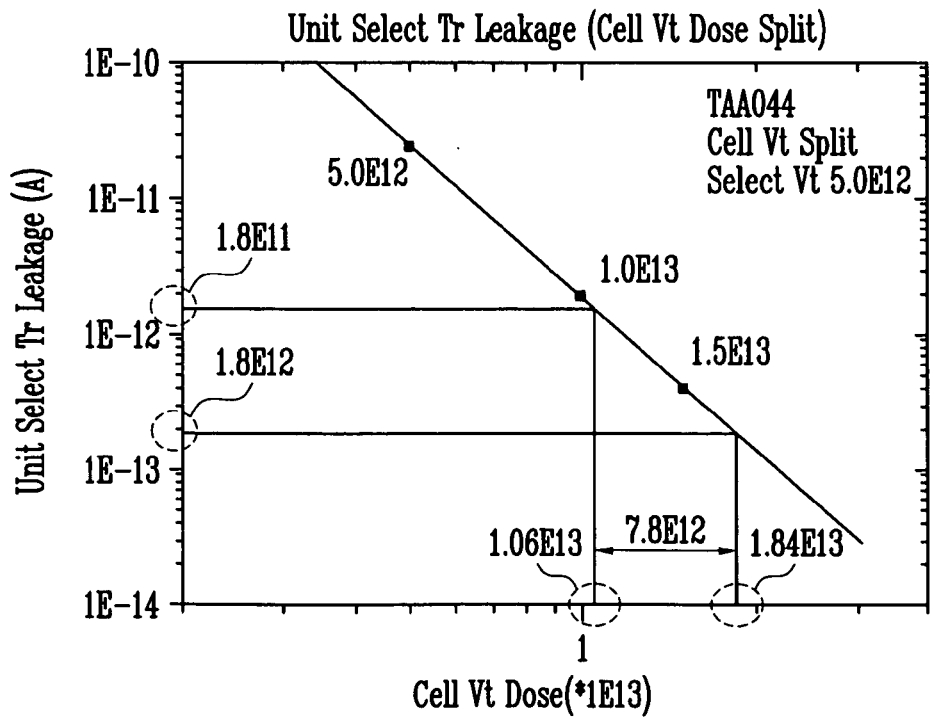
FIG. 3 is a graph showing the leakage current of a select transistor depending upon ion implant dose for controlling a threshold voltage of a memory cell according to the present invention.

FIG. 1 is a flowchart illustrating a method of controlling the gate length of the select transistor according to the present invention. FIG. 2 is a graph showing the leakage current of a select transistor depending upon the gate electrode length of the select transistor according to the present invention. FIG. 3 is a graph showing the leakage current of a select transistor depending upon ion implant dose for controlling a threshold voltage of a memory cell according to the present invention.

Referring to FIGS. 1, 2 and 3, in order to omit an ion implant process for controlling a threshold voltage of the select transistor, it is determined whether the length of the gate electrode of the select transistor can be increased (S1).

The leakage current of the select transistor is confirmed with the length of each of the gate electrodes (S2) (see FIG. 2). In this step, the leakage current of the select transistor, which corresponds to the size of a gate electrode of a current select transistor is confirmed with reference to FIG. 2, which is a graph showing the relation between the leakage current and the length of the gate electrode. According to an embodiment of the present invention, the length of a gate electrode of a select transistor is 0.22 µm, and the leakage current of the select transistor accordingly is 1.8E11.

After the leakage current of the select transistor for the length of each gate electrode is confirmed, the leakage current of the select transistor depending upon the ion implant dose for controlling a threshold voltage of a memory cell is confirmed with reference to FIG. 3 (S3). In this step, the ion implant dose for controlling the threshold voltage of the memory cell, which corresponds to the leakage current of the select transistor is confirmed with reference to FIG. 3, which is a graph showing the relation between the leakage current and the dose of ion implant. According to an embodiment of the present invention, the leakage current of the select transistor, which is checked from FIG. 2 is 1.8E11. The ion implant dose for controlling the threshold voltage of the memory cell accordingly is 1.06E13.

After the ion implant dose for controlling the threshold voltage of the memory cell is confirmed, the length of the gate electrode of the select transistor having the same difference as that of the ion implant dose of the threshold voltage of the memory cell from the viewpoint of the leakage current of the select transistor is confirmed with reference to FIG. 3 (S4).

The ion implant dose for controlling the threshold voltage of the memory cell is 1.06E13 in FIG. 3. However, in order for a desired ion implant dose for controlling the threshold voltage of the memory cell to be 1.84E13, the leakage current of the select transistor has to become 1.8E12. Therefore, the length of the gate electrode, wherein the leakage current of the select transistor becomes 1.8E12, can be found in FIG. 2.

In the prior art, in order for the cell threshold voltage ion implant dose having 1.06E13 to have a desired cell threshold voltage ion implant dose of 1.84E13, the ion implant process for controlling the threshold voltage of the select transistor is performed so that it has the dose of about 7.8E12. In the present invention, however, the ion implant process for controlling the threshold voltage of the select transistor in the prior art is skipped. The leakage current of the select transistor having the memory cell threshold voltage ion implant dose of 1.84E13, so that the gate length of the select transistor corresponding to the leakage current of the select transistor is increased in a next step.

Thereafter, the gate length in which the leakage current of the select transistor becomes 1.8E12 is found from FIG. 2. In step S5, the gate length of the select transistor is increased is performed.

In this step, after the leakage current of the select transistor in which the length of the gate electrode becomes 1.8E12 is 0.265 µm is found through FIG. 2, the gate length of the select transistor is expanded to up to 0.265 µm.

In this case, the gate length of the select transistor is not increased in the drain contact plug and the source contact plug direction, but toward the direction where a space with the memory cell located at the edge portion of the select transistor narrows.

Further, if the leakage current is not sufficiently controlled only by increasing the gate length of the select transistor, the ion implant dose for controlling the threshold voltage of the memory cell can be further increased.

As described above, according to the present invention, an ion implant process for controlling a threshold voltage of a select transistor is skipped, and the length of a gate electrode of a select transistor the leakage current of which is controlled only by an ion implant process for controlling a threshold voltage of a memory cell is increased. Therefore, even though the ion implant process for controlling the threshold voltage of the select transistor is skipped, there is an effect in that the leakage current of the select transistor is controlled when the ion implant process for controlling the threshold voltage of the select transistor as in the prior art is performed.

Furthermore, since the ion implant process for controlling the threshold voltage of the select transistor is skipped, an ion implant process for controlling a threshold voltage of a select transistor, which results in an irregular ion implant region, is omitted. Accordingly, there are effects in that device characteristics of a select transistor can be secured, and process steps can be reduced. Moreover, even though the ion implant process for controlling the threshold voltage of the select transistor is skipped, there is an effect that the leakage current of the select transistor is controlled when the ion implant process for controlling the threshold voltage of the select transistor as in the prior art is performed.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A method of manufacturing a select transistor in a NAND flash memory, comprising:
   providing a first graph showing a relation between gate widths of a select transistor and leakage currents of the select transistor, and a second graph showing a relation between ion implant doses for controlling a threshold voltage of a memory cell arid the leakage currents of the select transistor;
   reading a first leakage current as a first gate width of the select transistor that is currently being used in the first graph;
   reading a first ion implant dose for controlling the threshold voltage of the memory cell as the first leakage current of the select transistor in the second graph;
   reading a second leakage current of the select transistor to meet the first ion implant dose of the memory cell in the second graph;
   reading a second gate width of the select transistor as the second leakage current of the select transistor in the first graph;
   increasing the first gate width of the select transistor to the second gate width of the select transistor; and
   applying the first ion implant dose to the memory cell.

2. The method of the claim 1, comprising increasing the first gate width of the select transistor to a direction of adjacent to a word line so that space between the select transistor and the adjacent word line to the select transistor is reduced.

3. A method of manufacturing a select transistor in a NAND flash memory, comprising the steps of:

providing a graph showing a relation between gate widths of a select transistor and leakage currents of the select transistor, and a graph showing a relation between ion implant doses for controlling a threshold voltage of a memory cell and the leakage currents of the select transistor;

reading a first leakage current as a first gale width of the select transistor, that is currently being used, and reading a first ion implant dose for controlling the threshold voltage of the memory cell as the first leakage current of the select transistor;

reading a second leakage current of the select transistor to meet the first ion implantation dose of the memory cell, and reading a second gate width of the select transistor as the second leakage current of the select transistor; and increasing the first gate width of the select transistor to the second gate width of the select transistor wherein the first gate width of the select transistor is increased to a direction of adjacent to a word line so that space between the select transistor and the adjacent word line to the select transistor is reduced.

4. The method of the claim 1, further comprising increasing the first ion implant dose to the memory cell when the first leakage current of the select transistor is not controlled.

5. The method of the claim 3, further comprising increasing the first Ion implant dose to the memory cell when the first leakage current of the select transistor is not controlled.

* * * * *